United States Patent
Chang et al.

(10) Patent No.: US 10,171,907 B1
(45) Date of Patent: Jan. 1, 2019

(54) FAN NOISE CONTROLLING SYSTEM

(71) Applicant: Chung Yuan Christian University, Taoyuan (TW)

(72) Inventors: Cheng-Yuan Chang, Taoyuan (TW); Sen-Maw Kuo, Taoyuan (TW)

(73) Assignee: Chung Yuan Christian University (TW)

( * ) Notice: Subject to any disclaimer, the term of this patent is extended or adjusted under 35 U.S.C. 154(b) by 0 days.

(21) Appl. No.: 15/869,159

(22) Filed: Jan. 12, 2018

(30) Foreign Application Priority Data

Sep. 20, 2017 (TW) .............................. 106132198 A

(51) Int. Cl.
  *H04R 3/00* (2006.01)
  *H05K 7/20* (2006.01)
  *G10K 11/178* (2006.01)

(52) U.S. Cl.
  CPC .......... *H04R 3/002* (2013.01); *G10K 11/1781* (2018.01); *H05K 7/20145* (2013.01); *H05K 7/20172* (2013.01); *H05K 7/20209* (2013.01); *G10K 2210/3226* (2013.01); *H04R 2410/05* (2013.01)

(58) Field of Classification Search
  CPC .......... H05K 7/20145; H05K 7/20172; H05K 7/20209; H04R 2410/05; H04R 3/002; G10K 11/178; G10K 11/1781; G10K 2210/3226
  USPC .... 381/13, 317, 71.1, 71.2, 71.3, 71.5, 71.8, 381/94.1
  See application file for complete search history.

(56) References Cited

U.S. PATENT DOCUMENTS

| | | | | |
|---|---|---|---|---|
| 5,748,750 A | * | 5/1998 | L'Esperance | G10K 11/178 381/71.5 |
| 6,295,363 B1 | * | 9/2001 | Laak, Jr. | G10K 11/161 381/71.1 |
| 2003/0053635 A1 | * | 3/2003 | Carme | G10K 11/178 381/71.5 |
| 2003/0136328 A1 | * | 7/2003 | Granziera | G10K 9/20 116/59 |
| 2008/0240455 A1 | * | 10/2008 | Inoue | G10K 11/178 381/71.4 |
| 2010/0028134 A1 | * | 2/2010 | Slapak | F24F 13/24 415/119 |
| 2017/0076709 A1 | * | 3/2017 | Ku | G10K 11/178 |
| 2018/0025717 A1 | * | 1/2018 | Ku | G10K 11/178 381/71.11 |

* cited by examiner

*Primary Examiner* — William A Jerez Lora

(57) ABSTRACT

The present invention discloses a fan noise controlling system, comprising: at least one cylinder-shaped limiter, a plurality of error sensors, a noise controlling module, and at least one loudspeaker. According to the particular design of the present invention, the cylinder-shaped limiter is connected to a fan device for confining the transmission path of at least one fan noise signal. On the other hand, the error sensors are disposed in the internal of the cylinder-shaped limiter, and the loudspeaker is disposed at an axis position of the fan device. When this fan controlling system normally works, the noise controlling module is able to generate at least one anti-noise signal according to a plurality of error signals collected by the error sensors at consecutive previous time points, and then the loudspeaker is driven to broadcast the anti-noise signal for carrying out an outstanding efficacy on the cancellation of the fan noise.

16 Claims, 7 Drawing Sheets

FAN NOISE CONTROLLING SYSTEM

BACKGROUND OF THE INVENTION

1. Field of the Invention

The present invention relates to the technology field of noise controlling and attenuating systems, and more particularly to a fan noise controlling system.

2. Description of the Prior Art

Engineers skilled in design and development of desk computers have well known that at least one heat dissipation fan device is implemented into the case of the desk computer, which is adopted for improving heat accumulation occurring in the internal of the case, so as to prevent the efficiency of the desk computer from being influenced by the heat accumulation. However, rotation of the blades of the fan device is found to produce an audible and discomfort noise. Engineers skilled in design and development of fan devices further find that, difference of air flow velocity is produced between two terminal sides of each of the blades during the operation of the fan device, such that a variation of air flow is subsequently induced by the difference of air flow velocity. Moreover, the air flow variation leads to the friction occurring between the air flow and the blades; consequently, a wind noise, i.e., the discomfort noise, is made by the blades of the fan device. It is worth further explaining that, volume of the wind noise correspondingly changes with the level variation of the rotation speed of the blades. On the other hand, after the fan device is used for a long time, abrasion of the bearing would cause the blades rotate eccentrically during the operation of the fan device, such that other extra noises are produced due to bearing's wear and/or vibration.

Accordingly, fan device supplier has made great efforts to make inventive research and eventually provided a low-noise fan device. FIG. 1 shows a stereo diagram of a low-noise fan device, wherein the low-noise fan device 1' is attached onto a computer case 2', and comprises: a fan module 11' and a noise attenuating unit 12'. In FIG. 1, the noise attenuating unit 12' consists of a microphone, a microprocessor, an amplifier, and a loudspeaker, wherein the microphone is used for collecting at least one noise signal produced by the fan module 11' during the operation of the noise attenuating unit 12'. Moreover, the microprocessor is configured to generate an anti-noise signal by taking the collected noise signal as a reference signal, and then the anti-noise signal is transmitted to the amplifier for being treated with a signal amplifying process. Consequently, the microprocessor broadcasts the amplified anti-noise signal through the loudspeaker, so as to attenuate the noise signal by the anti-noise signal.

Engineers skilled in design and development of noise controlling attenuating systems and fan devices should know that, the noise attenuating unit 12' cannot canceling or attenuating the noise made by the fan module 11' effectively and globally. The reasons are summarized and listed as follows:

(1) owing to the fact that the microphone and the loudspeaker are both disposed on the axis of the fan module 11', error providing of the reference signal resulting from the receiving of the noise signal and the anti-noise signal by the microphone causes the anti-noise signal generated by the microprocessor fail to globally attenuate the noise signal made by the fan module 11'.

(2) Since the wind noises mainly come from the friction occurring between air flows and the blades of the fan module 11', the single one microphone disposed on the axis of the fan module 11' is unable to receive all of the wind noises comprehensively. Moreover, it is probable that the microphone may collect the noise signal only comprising bearing vibration signal during the operation of the fan module 11'.

From above descriptions, it is clear that how to design and manufacture a noise cancelling system for effectively attenuating the noise produced by the fan device has become an important issue. In view of that, inventors of the present application have made great efforts to make inventive research and eventually provided a fan noise controlling system.

SUMMARY OF THE INVENTION

In view of the fact that conventional fan noise cancelling system cannot attenuate a fan noise generated by a fan device effectively and globally, the primary objective of the present invention is to provide a novel fan noise controlling system, comprising: at least one cylinder-shaped limiter, a plurality of error sensors, a noise controlling module, and at least one loudspeaker. According to the particular design of the present invention, the cylinder-shaped limiter is connected to the fan device for confining the transmission path of at least one fan noise signal. On the other hand, the error sensors are disposed in the internal of the cylinder-shaped limiter, and the loudspeaker is disposed at an axis position of the fan device. When this novel fan controlling system normally works, the fan controlling module is able to generate at least one anti-noise signal according to a plurality of error signals collected by the error sensors at consecutive previous time points, and then the loudspeaker is driven to broadcast the anti-noise signal for carrying out an outstanding efficacy on the cancellation of the fan noise.

In order to achieve the primary objective of the present invention, the inventor of the present invention provides an embodiment for the fan noise controlling system, comprising:

a first cylinder-shaped limiter, connected to the fan device, and locating at a wind-exporting side of the fan device; wherein the first cylinder-shaped limiter is used for limiting the transmission path of at least one fan noise signal made by the fan device;

a plurality of error sensors, disposed on the inner wall of the first cylinder-shaped limiter;

a noise controlling module, electrically connected to the plurality of error sensors; and a first loudspeaker, disposed on an axis of the fan device and electrically connected to the noise controlling module; moreover, the first loudspeaker locating in the internal of the first cylinder-shaped limiter;

wherein the noise controlling module generates at least one anti-noise signal according to a plurality of error noise signal collected by the plurality of error sensors at consecutive previous time points, and the first loudspeaker being driven by the noise controlling module to broadcast the anti-noise signal in the first cylinder-shaped limiter, so as to attenuate a fan noise made by the fan device.

The embodiment of the fan noise controlling system further comprises:

a second cylinder-shaped limiter, connected to the fan device, and locating at a wind-importing side of the fan device; wherein the inner wall of the second cylinder-shaped limiter is also provided with the plurality of the error sensors;

a second loudspeaker, connected to the axis of the fan device, and electrically connected to the noise controlling module; moreover, the second loudspeaker locating in the internal of the second cylinder-shaped limiter.

In the embodiment of the fan noise controlling system, the both the first cylinder-shaped limiter and the second cylinder-shaped limiter are selected from the group consisting of circular cylinder sleeve and polygonal-shaped cylinder sleeve. Moreover, both the inner wall of the first cylinder-shaped limiter and the inner wall of the second cylinder-shaped limiter are provided with a sound wave reflective surface thereon.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a fan noise controlling system disclosed by the present invention, embodiments of the present invention will be described in detail with reference to the attached drawings hereinafter.

First Embodiment

Figure 1:
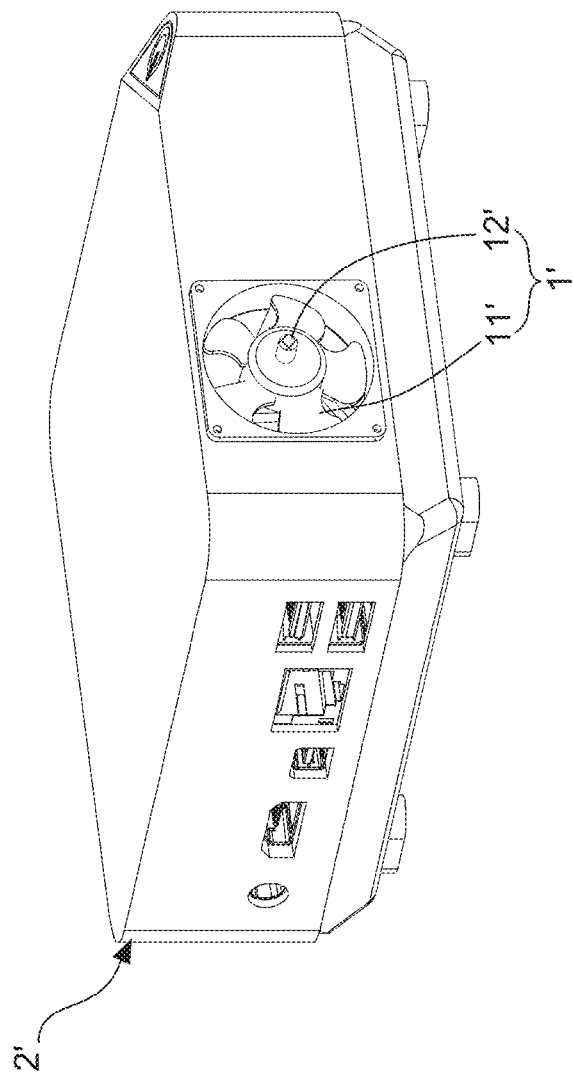
FIG. 1 shows a stereo diagram of a low-noise fan device.
Figure 2:
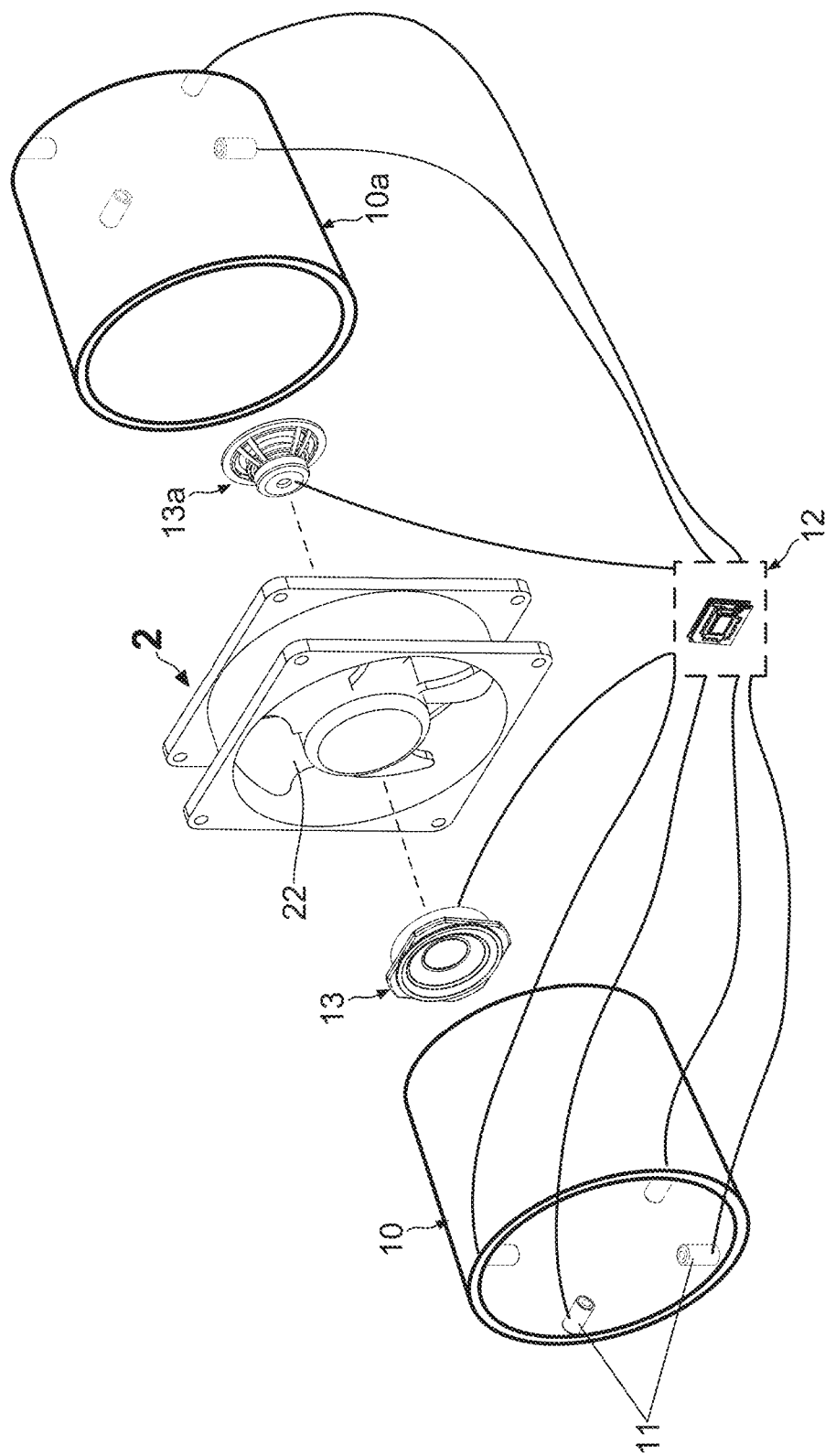
FIG. 2 shows a stereo diagram of a fan device with a fan noise controlling system provided by the present invention.

With reference to FIG. 2, there is shown a stereo diagram of a fan device with a fan noise controlling system provided by the present invention. From FIG. 2, it is understood that the said fan noise controlling system 1 is connected to a fan device 2 with a wind-importing side and a wind-exporting side, such as heat-dissipation fan for computer case, heat-dissipation fan for CPU or GPU, vapor exhaust fan, condenser fan, or motor-fan for hair dryer.

As FIG. 2 shows, the fan noise controlling system 1 comprises: a first cylinder-shaped limiter 10, a second cylinder-shaped limiter 10a, a plurality of error sensors 11, a noise controlling module 12, a first loudspeaker 13, and a second loudspeaker 13a, wherein the first cylinder-shaped limiter 10 is connected to the fan device 2 and locates at the wind-exporting side of the fan device 2. In contrast to the first cylinder-shaped limiter 10, the second cylinder-shaped limiter 10a is also connected to the fan device 2 but locates at the wind-importing side of the fan device 2. On the other hand, the error sensors 11 (such as error microphones) are disposed on the inner wall of the first cylinder-shaped limiter 10 and the inner wall of the second cylinder-shaped limiter 10a, and used for collecting noise signal and/or vibration signal made by the fan device 2. It has been known by engineers skilled in design and development of fan devices that, difference of air flow velocity is produced between two terminal sides of each of the blades during the operation of the fan device 2, such that a variation of air flow is subsequently induced by the difference of air flow velocity. Moreover, the air flow variation would lead to the friction occurring between the air flow and the blades; and consequently, a wind noise, i.e., the fan noise, is made by the blades of the fan device 2. In view of the fact that the fan noise mostly comes from the wind noises, the two cylinder-shaped limiters (10, 10a) are adopted for limiting the transmission path of at least one fan noise signal coming from the fan device 2. It is worth emphasizing that, both the inner wall of the first cylinder-shaped limiter 10 and the inner wall of the second cylinder-shaped limiter 10a are provided with a sound wave reflective surface thereon for enhancing the limitation effect of the transmission path; for example, a rigid smooth surface.

In addition, the first speaker 13 is disposed on an axis of the fan device 2, and locates at the wind-exporting side of the fan device 2. In contrast to the first speaker 13, the second speaker 13a is also disposed on the axis of the fan device 2, but locates at the wind-importing side of the fan device 2. Please simultaneously refer to FIG. 3, which illustrates a first circuit block diagram of the noise controlling module. From FIG. 2 and FIG. 3, electronic engineers should know that the noise controlling module 12 is a digital signal processor (DSP), an IC of field programmable gate array (FPGA) or an ARM processor. In the present invention, the noise controlling module 12 is electrically connected to the error sensors 11, and comprises: a first analog-to-digital converter 121, a signal synthesizer 123, a signal processing unit 120, and a digital-to-analog converter 122.

Figure 3:
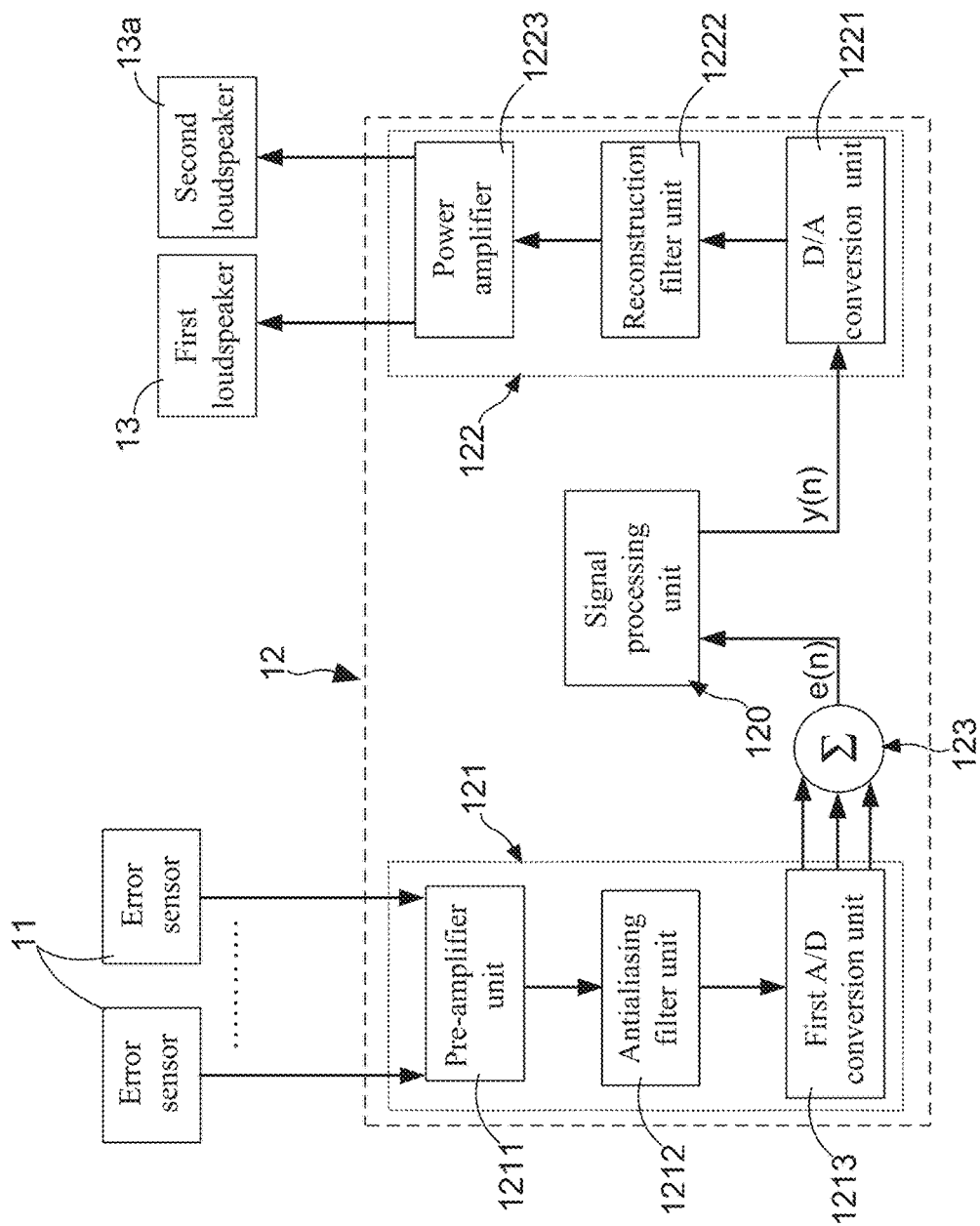
FIG. 3 shows a first circuit block diagram of a noise controlling module of the fan noise controlling system.

As FIG. 3 shows, the first analog-to-digital converter 121 is electrically connected to the plurality of error sensors 11, which is configured for converting a plurality of error noise signal collected by the error sensors 11 to a plurality of digital error noise signal. Next, the plurality of digital error noise signal are synthesized to a synthesis noise signal (e(n)) by a signal synthesizer 123 electrically connected to the first analog-to-digital converter 121. Subsequently, the synthesis noise signal (e(n)) is processed to at least one digital anti-noise signal (y(n)) by the signal processing unit 120 electrically connected to the signal synthesizer 123. Consequently, the digital anti-noise signal (y(n)) is converted to at least one anti-noise signal by the digital-to-analog converter 122 electrically connected to the signal processing unit 120. It needs to further explain that, the first analog-to-digital converter 121 comprises a pre-amplifier unit 1211, an antialiasing filter unit 1212 and a first analog-to-digital conversion unit 1213. Moreover, the first digital-to-analog converter 122 comprises digital-to-analog conversion unit 1221, a reconstruction filter unit 1222 and a power amplifier 1223.

In the first embodiment of the fan noise controlling system 1, the noise controlling module 12 is configured for generating at least one anti-noise signal at consecutive instant time points (n) according to the plurality of error noise signal collected by the plurality of error sensors 11 at consecutive previous time points (n−1). Accordingly, the first loudspeaker 13 and the second loudspeaker 13a are driven by the noise controlling module 12 to broadcast the anti-noise signal in the first cylinder-shaped limiter 10 and the second cylinder-shaped limiter 10a at the same time. As a result, attenuation for the fan noise (i.e., the wind noise) made by the fan device 2 is achieved.

Figure 4:
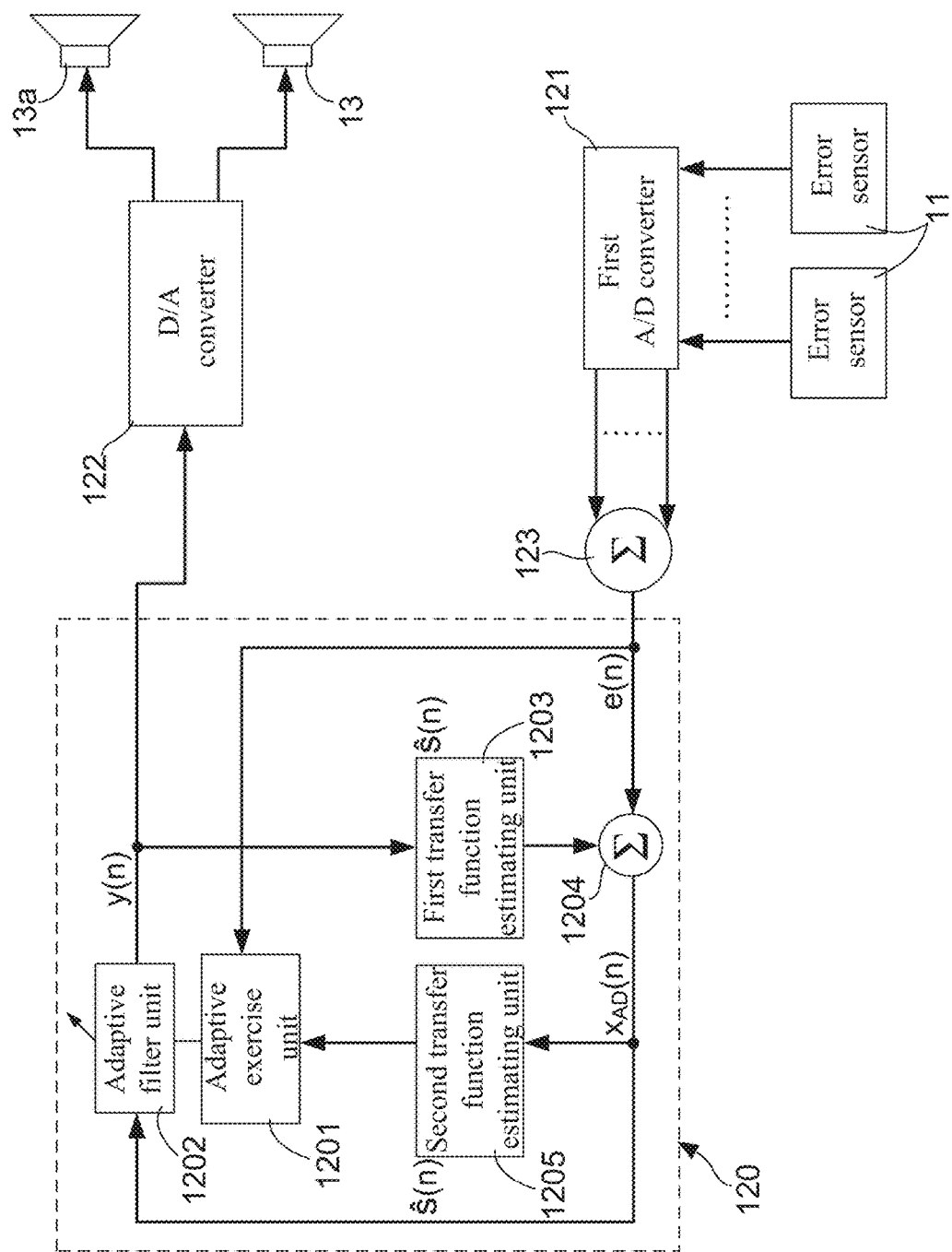
FIG. 4 shows a first inner topology diagram of a signal processing unit of the noise controlling module.

Please also simultaneously refer to FIG. 4, where a first inner topology diagram of the signal processing unit is provided. In the first embodiment of the fan noise controlling system 1, the signal processing unit 120 comprises: an adaptive exercise unit 1201 coupled to the signal synthesizer 123, an adaptive filter unit 1202 coupled to the adaptive exercise unit 1201, a first transfer function estimating unit 1203, a subtractor 1204, and a second transfer function estimating unit 1205. In which the said adaptive filter unit 1202 is a finite impulse response (FIR) filter, an infinite impulse response (IIR) filter, or any other similar filters. Moreover, the adaptive exercise unit 1201 comprises a specific algorithm, such as least mean square (LMS) algorithm, normalized least mean square (NLMS) algorithm, or any other similar algorithms. It is worth explaining that, since the signal processing unit 120 includes the first transfer function estimating unit 1203 and the second transfer function estimating unit 1205, the LMS algorithm is further called filtered-x LMS algorithm when being used in the adaptive exercise unit 1201.

As FIG. 4 shows, the first transfer function estimating unit 1203 is coupled to the adaptive filter unit 1202 and mathematically presented as $\hat{S}(z)$, which is used for applying one filtering process to the digital anti-noise signal (y(n)) outputted from the adaptive filter unit 1202. Moreover, the subtractor 1204 is coupled to the first analog-to-digital converter 121 and the first transfer function estimating unit 1203 for receiving the digital anti-noise signal (y(n)) outputted from the first analog-to-digital converter 121 and the synthesis noise signal (e(n)) generated by the signal synthesizer 123. Therefore, after applying an acoustic superposition process to the received digital anti-noise signal (y(n)) and synthesis noise signal (e(n)), the adder unit 1204 outputs an adaptive noise signal ($x_{AD}(n)$) to the second transfer function estimating unit 1205 mathematically presented as $\hat{S}(z)$. In contrast to the first transfer function estimating unit 1203, the second transfer function estimating unit 1205 is coupled to the subtractor 1204 for receiving the adaptive noise signal ($x_{AD}(n)$), so as to apply one filtering process to the adaptive noise signal ($x_{AD}(n)$). From FIG. 4, it is found that, the adaptive noise signal ($x_{AD}(n)$) is simultaneously transmitted to the adaptive filter unit 1202 for being treated with one filtering process. Moreover, after being treated with the filtering process, the adaptive noise signal is subsequently transmitted from the adaptive filter unit 1202 to the adaptive exercise unit 1201, such that the adaptive exercise unit 1201 calculates and provides a weight signal ($w_f(n)$) to the adaptive filter unit 1202.

Furthermore, according to the weight signal ($w_f(n)$) and the adaptive noise signal ($x_{AD}(n)$), the adaptive filter unit 1202 generates and outputs the digital anti-noise signal (y(n)) to the first digital-to-analog converter 122. Therefore, after converting the digital anti-noise signal (y(n)) to an anti-noise signal, the fan noise of the fan device 2 is canceled or attenuated by the anti-noise signal broadcasted by the first loudspeaker 13 and the second loudspeaker 13a.

Second Embodiment

Figure 5:
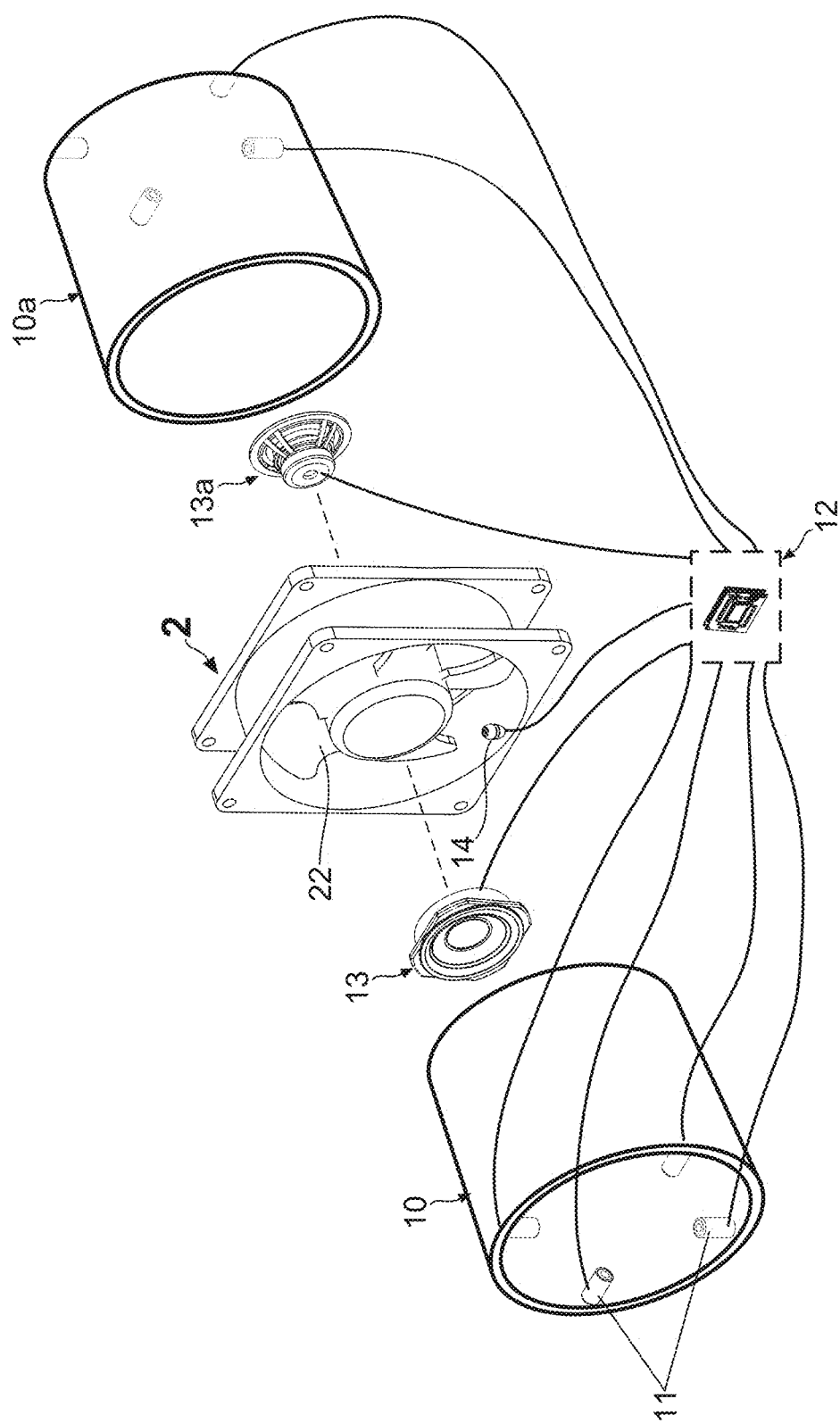
FIG. 5 shows a stereo diagram of the fan device with the fan noise controlling system provided by the present invention.

With reference to FIG. 5, there is shown a stereo diagram of a fan device with a fan noise controlling system provided by the present invention. After comparing FIG. 5 with FIG. 2, it is understood that the second embodiment for the fan noise controlling system 1 is obtained by adding a rotation speed sensor 14 or a vibration sensor into the above-introduced framework of the first embodiment. As FIG. 5 shows, the rotation speed sensor 14 (or the vibration sensor) is electrically connected to the noise controlling module 12 for detecting a rotation speed signal (or a vibration signal) of the blades 22 of the fan device 2.

Figure 6:
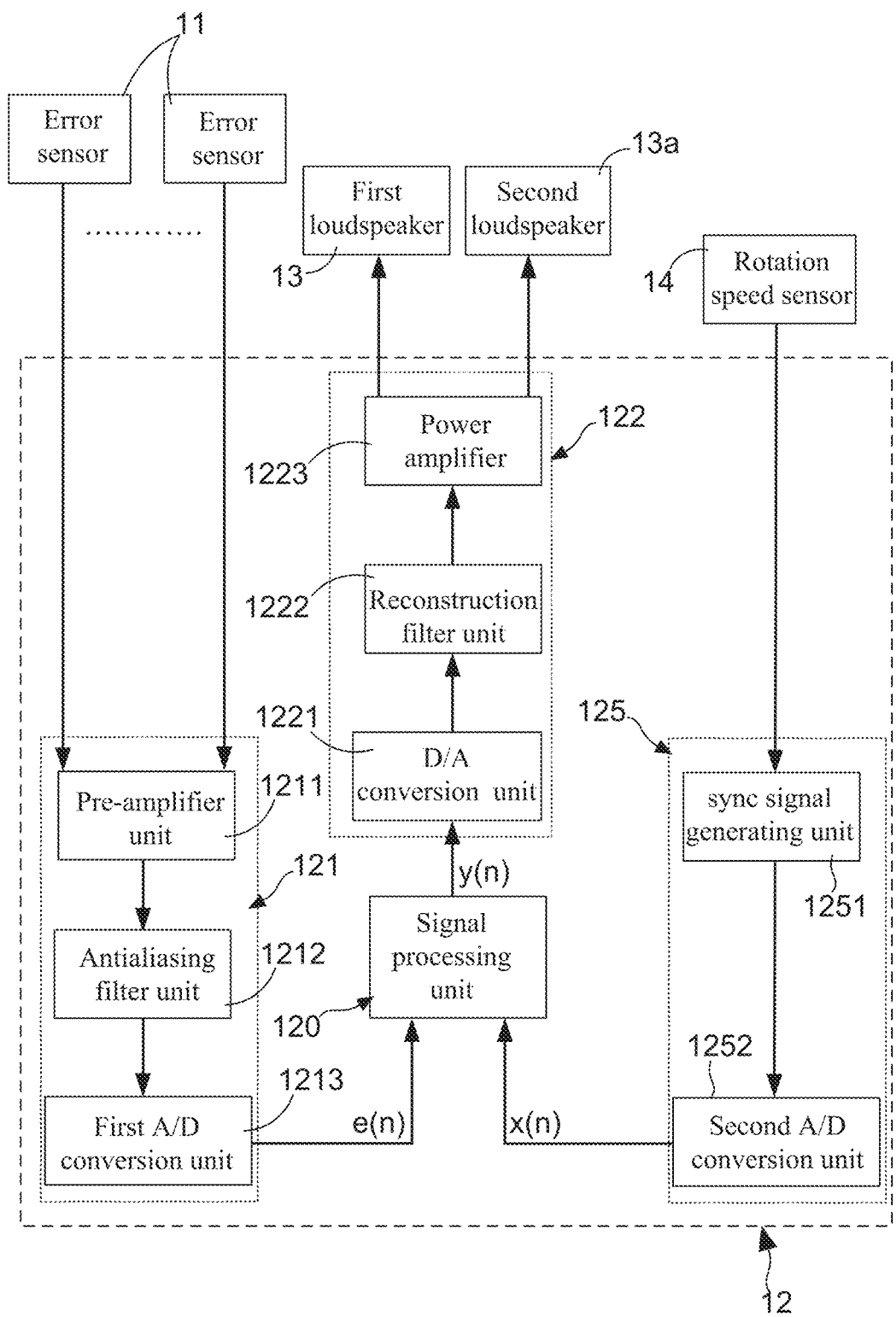
FIG. 6 shows a second circuit block diagram of the noise controlling module.

Continuously referring to FIG. 5, and please simultaneously refer to a second circuit block diagram of the noise controlling module provided in FIG. 6. In second embodiment of the fan noise controlling system 1, the noise controlling module 12 comprises: a first analog-to-digital converter 121, a signal processing unit 120, a digital-to-analog converter 122, and a second analog-to-digital converter 125, wherein the second analog-to-digital converter 125 is electrically connected to the rotation speed sensor 14 (or the vibration sensor) and the signal processing unit 120. From FIG. 6, it is known that the second analog-to-digital converter 125 comprises a synchronization signal generating unit 1251 and a second analog-to-digital conversion unit 1252. The synchronization signal generating unit 1251 is configured for generating a plurality of synchronous data samples based on the rotation speed signal (or the vibration signal) with various noise frequencies according to the rotation speed signal, and the second analog-to-digital conversion unit 1252 coupled to the synchronization signal generating unit 1251 is used for converting the plurality of synchronous data samples to a plurality of digital noise signal (x(n)).

Figure 7:
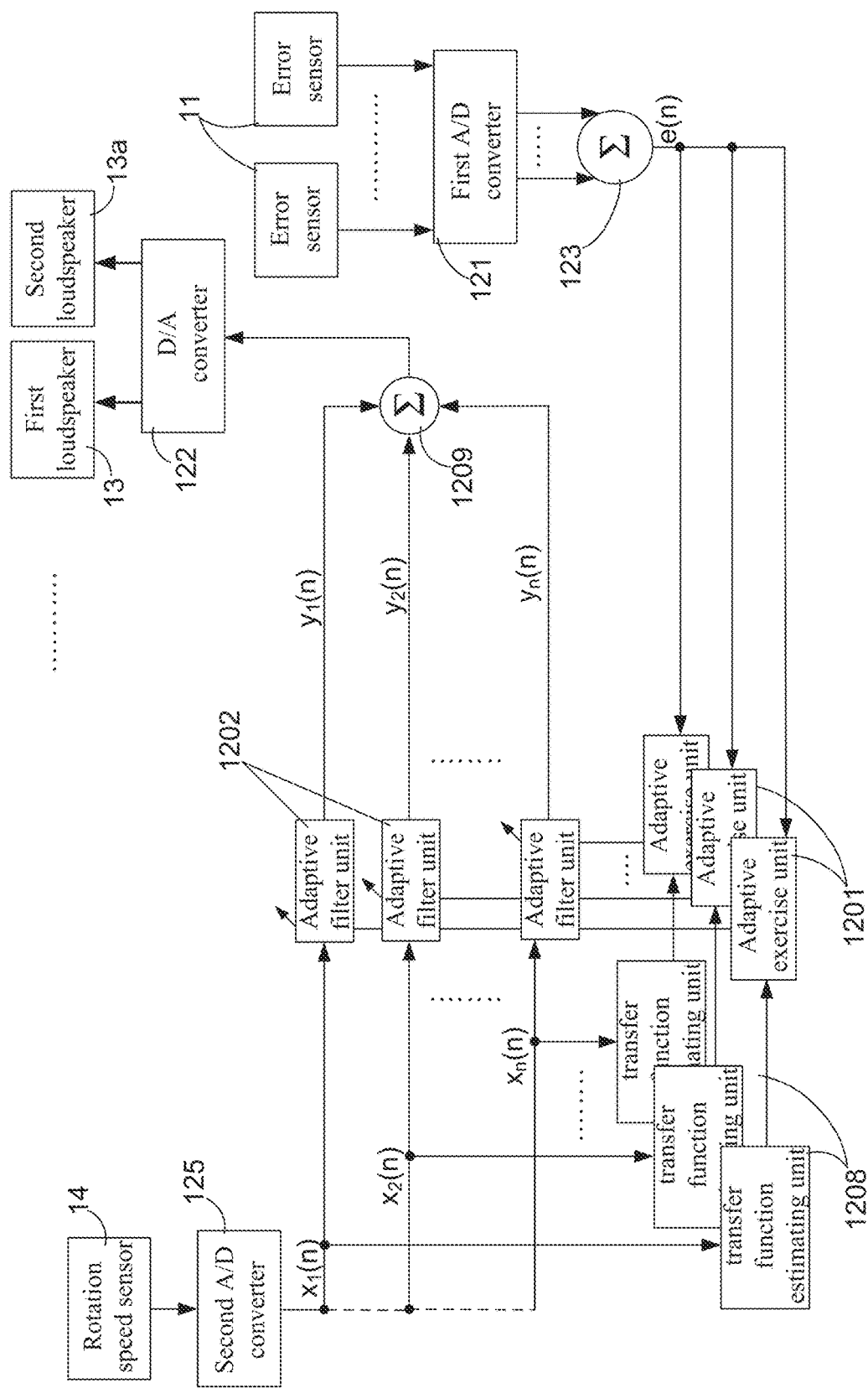
FIG. 7 shows a second inner topology diagram of the signal processing unit.

Please also simultaneously refer to FIG. 7, which illustrates a second inner topology diagram of the signal processing unit. According to FIG. 6 and FIG. 7, engineers skilled in design and development of noise controlling devices or systems are able to know that, the digital noise signal converted from the rotation speed signal (or the vibration signal) is transmitted to the plurality of adaptive filter units 1202 for being treated with one filtering process; and subsequently, the digital noise signal is next transmitted to the plurality of adaptive exercise units 1201, respectively. Therefore, the adaptive exercise units 1201 calculate and correspondingly provide a plurality of weight signal to the plurality of adaptive filter units 1202. Furthermore, the plurality of adaptive filter units 1202 are able to generate and output corresponding anti-noise signal according to the received digital noise signal and the weight signal. Eventually, the first loudspeaker 13 and the second loudspeaker 13a are driven to broadcast the anti-noise signal for carrying out an outstanding efficacy on the cancellation of the fan noise.

From FIG. 7, it is found that the inner framework of the signal processing unit 120 is particularly arranged for facilitating the noise controlling module 12 able to process the error signal collected by the error sensors 11 and the rotation speed signal (the vibration signal) measured by the rotation speed sensor 14 (the vibration sensor). The signal processing unit comprises: a plurality of adaptive filter units 1202, a plurality of adaptive exercise units 1201, a plurality of transfer function estimating units 1208, and an adder unit 1209.

The plurality of adaptive filter units 1202 are coupled to the second analog-to-digital converter 125, and the plurality of adaptive exercise units 1201 are coupled to the plurality of adaptive filter units 1202, respectively. On the other hand, the plurality of transfer function estimating units 1208 are coupled to the adaptive exercise units 1201, respectively; moreover, the plurality of transfer function estimating units 1208 are coupled to the second analog-to-digital converter 125, so as to apply one filtering process to the digital noise signal ($x_1(n), x_2(n), \ldots, x_n(n)$) outputted from the second analog-to-digital converter 125. In addition, the adder unit 1209 is coupled to the plurality of adaptive filter units 1202.

In second embodiment of the fan noise controlling system 1, the digital noise signal $(x_1(n), x_2(n), \ldots, x_n(n))$ are transmitted to the plurality of adaptive filter units 1202 for being treated with one filtering process; and subsequently, the digital noise signal $(x_1(n), x_2(n), \ldots, x_n(n))$ are next transmitted to the plurality of adaptive exercise units 1201, such that the adaptive exercise units 1201 calculate and correspondingly provide a plurality of weight signal to the plurality of adaptive filter units 1202. Therefore, the plurality of adaptive filter units 1202 output multi digital antinoise signal according to the plurality of weight signal and the digital noise signal. Consequently, the adder unit 1209 generates and provides a synthesis digital noise signal to the digital-to-analog converter 122 according to the plurality of weight signal and the multi digital noise signal. Eventually, after converting the synthesis digital noise signal to the said anti-noise signal, the first loudspeaker 13 and the second loudspeaker 13a are driven to broadcast the anti-noise signal for achieving an outstanding efficacy on the attenuation of the fan noise.

Therefore, through above descriptions, all embodiments and their constituting elements of the fan noise controlling system proposed by the present invention have been introduced completely and clearly; in summary, the present invention includes the advantages of:

(1) In view of the fact that conventional fan noise cancelling system cannot effectively attenuate a fan noise generated by a fan device, the present invention particularly discloses a novel fan noise controlling system 1, comprising: at least one cylinder-shaped limiter (10, 10a), a plurality of error sensors 11, a noise controlling module 12, and at least one loudspeaker (13, 13a). According to the specific design of the present invention, the cylinder-shaped limiter (10, 10a) is connected to the fan device 2 for confining the transmission path of at least one fan noise signal. On the other hand, the error sensors 11 are disposed in the internal of the cylinder-shaped limiter (10, 10a), and the loudspeaker (13, 13a) is disposed at an axis position of the fan device 2. When this novel fan controlling system 1 normally works, the controlling module 12 is able to generate at least one anti-noise signal according to a plurality of error signals collected by the error sensors 11 at consecutive previous time points, and then the loudspeaker (13, 13a) is driven to broadcast the anti-noise signal for carrying out an outstanding efficacy on the attenuation of the fan noise.

(2) Moreover, in order to cancel the fan noise globally, the present invention also provides a second embodiment for the fan noise controlling system 1 by adding a rotation speed sensor 14 (or a vibration sensor) into the above-introduced framework of the first embodiment. By such arrangement, the noise controlling module 12 is able to generates at least one anti-noise signal according to the error noise signal collected by the plurality of error sensors 11 as well as a rotation speed signal (or a vibration signal) detected by the rotation speed sensor 14 (or the vibration sensor) at consecutive previous time points. Therefore, the loudspeaker (13, 13a) are driven by the noise controlling module 12 to broadcast the anti-noise signal in the first cylinder-shaped limiter 10, so as to globally cancel the fan noise.

The above description is made on embodiments of the present invention. However, the embodiments are not intended to limit scope of the present invention, and all equivalent implementations or alterations within the spirit of the present invention still fall within the scope of the present invention.

What is claimed is:

1. A fan noise controlling system, being connected to a fan device and comprising:
    a first cylinder-shaped limiter, being connected to the fan device, and located at a wind-exporting side of the fan device; wherein the inner wall of the first cylinder-shaped limiter is provided with a sound wave reflective surface thereon, such that the first cylinder-shaped limiter is used for limiting the transmission path of at least one fan noise signal made by the fan device;
    a plurality of error sensors, being disposed on the inner wall of the first cylinder-shaped limiter;
    a noise controlling module, being electrically connected to the plurality of error sensors; and
    a first loudspeaker, being disposed on an axis of the fan device and electrically connected to the noise controlling module; moreover, the first loudspeaker located in the internal of the first cylinder-shaped limiter;
    wherein the noise controlling module generates at least one anti-noise signal according to a plurality of error noise signal collected by the plurality of error sensors at consecutive previous time points, and the first loudspeaker being driven by the noise controlling module to broadcast the anti-noise signal in the first cylinder-shaped limiter, so as to attenuate a fan noise made by the fan device.

2. The fan noise controlling system of claim 1, further comprising:
    a second cylinder-shaped limiter, being connected to the fan device, and located at a wind-importing side of the fan device; wherein the inner wall of the second cylinder-shaped limiter is also provided with the plurality of the error sensors;
    a second loudspeaker, being connected to the axis of the fan device, and electrically connected to the noise controlling module; moreover, the second loudspeaker located in the internal of the second cylinder-shaped limiter.

3. The fan noise controlling system of claim 1, wherein the noise controlling module is a digital signal processor or a microprocessor.

4. The fan noise controlling system of claim 1, wherein the error sensor is an error microphone.

5. The fan noise controlling system of claim 1, wherein the noise controlling module comprises:
    a first analog-to-digital converter, being electrically connected to the plurality of error sensors for converting the plurality of error noise signal to a plurality of digital error noise signal;
    a signal synthesizer, being electrically connected to the first analog-to-digital converter for generating a synthesis noise signal;
    a signal processing unit, being electrically connected to the signal synthesizer for processing the synthesis noise signal to at least one digital anti-noise signal; and
    a digital-to-analog converter, being electrically connected to the signal processing unit for converting the digital anti-noise signal to at least one analog anti-noise signal.

6. The fan noise controlling system of claim 2, wherein both the first cylinder-shaped limiter and the second cylinder-shaped limiter are selected from the group consisting of circular cylinder sleeve and polygonal-shaped cylinder sleeve.

7. The fan noise controlling system of claim 2, wherein the inner wall of the second cylinder-shaped limiter is also provided with the sound wave reflective surface thereon.

8. The fan noise controlling system of claim 5, wherein the first analog-to-digital converter comprises a pre-amplifier unit, an antialiasing filter unit and a first analog-to-digital conversion unit.

9. The fan noise controlling system of claim 5, wherein the first digital-to-analog converter comprises a digital-to-analog conversion unit, a reconstruction filter unit and a power amplifier.

10. The fan noise controlling system of claim 5, wherein the signal processing unit comprises:
an adaptive exercise unit, being coupled to the signal synthesizer;
an adaptive filter unit, being coupled to the adaptive exercise unit;
a first transfer function estimating unit, being coupled to the adaptive filter unit for applying one filtering process to the digital anti-noise signal outputted from the adaptive filter unit;
a subtractor, being coupled to the first analog-to-digital converter and the first transfer function estimating unit for receiving the digital anti-noise signal outputted from the first analog-to-digital converter and the digital anti-noise signal been treated with the filtering process by the first transfer function estimating unit; and
a second transfer function estimating unit, being coupled to the subtractor for receiving an adaptive noise signal outputted from the subtractor, so as to apply one filtering process to the adaptive noise signal;
wherein the adaptive noise signal is simultaneously transmitted to the adaptive filter unit for being treated with one filtering process; moreover, the adaptive noise signal being subsequently transmitted to the adaptive exercise unit, such that the adaptive exercise unit calculates and provides a weight signal to the adaptive filter unit;
wherein the adaptive filter unit outputs the digital anti-noise signal according to the weight signal and the adaptive noise signal.

11. The fan noise controlling system of claim 5, further comprising:
a rotation speed sensor, being electrically connected to the noise controlling module, and used for detecting a rotation speed signal of the fan device.

12. The fan noise controlling system of claim 11, wherein the noise controlling module further comprises:
a second analog-to-digital converter, being electrically connected to the rotation speed sensor and the signal processing unit, and comprising:
a synchronization signal generating unit, being configured for generating a plurality of synchronous data samples based on the rotation speed signal with various noise frequencies; and
a second analog-to-digital conversion unit, being coupled to the synchronization signal generating unit for converting the plurality of synchronous data samples to a plurality of digital noise signal.

13. The fan noise controlling system of claim 12, wherein the signal processing unit comprises:
a plurality of adaptive filter units, being coupled to the second analog-to-digital converter;
a plurality of adaptive exercise units, being coupled to the plurality of adaptive filter units, respectively;
a plurality of transfer function estimating units, being coupled to the adaptive exercise units, respectively; moreover, each of the plurality of transfer function estimating units being coupled to the second analog-to-digital converter, so as to apply one filtering process to the digital noise signal outputted from the second analog-to-digital converter; and
an adder unit, being coupled to the plurality of adaptive filter units;
wherein the digital noise signal is simultaneously transmitted to the plurality of adaptive filter units for being treated with one filtering process; moreover, the digital noise signal being subsequently transmitted to the plurality of adaptive exercise units, such that the adaptive exercise units calculate and correspondingly provide a plurality of weight signal to the plurality of adaptive filter units;
wherein the plurality of adaptive filter units output the different digital anti-noise signal according to the plurality of weight signal and the digital noise signal, such that the adder unit generates and provides a synthesis digital noise signal to the digital-to-analog converter according to the plurality of weight signal and the digital noise signal.

14. The fan noise controlling system of claim 5, further comprising:
a vibration sensor, being electrically connected to the noise controlling module, and used for detecting a vibration signal from the fan device.

15. The fan noise controlling system of claim 14, wherein the noise controlling module further comprises:
a second analog-to-digital converter, being electrically connected to the vibration sensor and the signal processing unit, and comprising:
a synchronization signal generating unit, being configured for generating a plurality of synchronous data samples based on the vibration signal with various noise frequencies; and
a second analog-to-digital conversion unit, being coupled to the synchronization signal generating unit for converting the plurality of synchronous data samples to a plurality of digital noise signal.

16. The fan noise controlling system of claim 15, wherein the signal processing unit comprises:
a plurality of adaptive filter units, being coupled to the second analog-to-digital converter;
a plurality of adaptive exercise units, being coupled to the plurality of adaptive filter units, respectively;
a plurality of transfer function estimating units, being coupled to the adaptive exercise units, respectively; moreover, each of the plurality of transfer function estimating units being coupled to the second analog-to-digital converter, so as to apply one filtering process to the digital noise signal outputted from the second analog-to-digital converter; and
an adder unit, being coupled to the plurality of adaptive filter units;
wherein the digital noise signal is simultaneously transmitted to the plurality of adaptive filter units for being treated with one filtering process; moreover, the digital noise signal being subsequently transmitted to the plurality of adaptive exercise units, such that the adaptive exercise units calculate and correspondingly provide a plurality of weight signal to the plurality of adaptive filter units;
wherein the plurality of adaptive filter units output the different digital anti-noise signal according to the plurality of weight signal and the digital noise signal, such that the adder unit generates and provides a synthesis digital noise signal to the digital-to-analog converter according to the plurality of weight signal and the digital noise signal.

* * * * *